(12) United States Patent
Trunk et al.

(10) Patent No.: US 10,232,718 B2
(45) Date of Patent: Mar. 19, 2019

(54) ON-BOARD ELECTRICAL SYSTEM ISOLATING CIRCUIT FOR DC/DC CONVERTERS, AND METHOD FOR ISOLATING AN ON-BOARD ELECTRICAL SYSTEM FROM A DC/DC CONVERTER

(71) Applicant: Robert Bosch GmbH, Stuttgart (DE)

(72) Inventors: Martin Trunk, Neuenstadt (DE);
Marcus Rosenberger, Schwieberdingen (DE)

(73) Assignee: Robert Bosch GmbH, Stuttgart (DE)

( * ) Notice: Subject to any disclaimer, the term of this patent is extended or adjusted under 35 U.S.C. 154(b) by 217 days.

(21) Appl. No.: 15/114,733

(22) PCT Filed: Nov. 27, 2014

(86) PCT No.: PCT/EP2014/075776
§ 371 (c)(1),
(2) Date: Jul. 27, 2016

(87) PCT Pub. No.: WO2015/133673
PCT Pub. Date: Aug. 6, 2015

(65) Prior Publication Data
US 2017/0087997 A1     Mar. 30, 2017

(30) Foreign Application Priority Data

Jan. 29, 2014   (DE) .................. 10 2014 201 581

(51) Int. Cl.
*B60L 1/00*      (2006.01)
*B60L 11/18*     (2006.01)
(Continued)

(52) U.S. Cl.
CPC ........ *B60L 11/1811* (2013.01); *H02H 7/1255* (2013.01); *H02M 1/32* (2013.01);
(Continued)

(58) Field of Classification Search
CPC .......... H02M 3/33592; H02M 3/33507; Y02B 70/1475; Y02B 70/1433; Y02B 70/1491;
(Continued)

(56) References Cited

U.S. PATENT DOCUMENTS 5,943,203 A * 8/1999 Wang .................. H02H 9/001
                                                                361/103
6,222,742 B1   4/2001 Schlecht

FOREIGN PATENT DOCUMENTS

CN      1518791 A    8/2004
CN    202395637 U    8/2012
(Continued)

OTHER PUBLICATIONS

International Search Report for Application No. PCT/EP2014/075776 dated Feb. 9, 2015 (English Translation, 2 pages).

*Primary Examiner* — Sibin Chen
(74) *Attorney, Agent, or Firm* — Michael Best & Friedrich LLP

(57) ABSTRACT

The invention relates to an on-board electrical system supply system (1), having a DC/DC converter (11) with at least one semiconductor rectifier element (4), having two supply connections (9a, 9b) for an on-board electrical system, which supply connections are connected at the output end to the DC/DC converter (11), having an isolating switch (5) which is coupled between one of the supply connections (9a, 9b) and the DC/DC converter (11), and having an on-board electrical system isolating circuit (10) which is designed to determine a reverse voltage (U, Ua, Ub) across at least one of the semiconductor rectifier elements (4), and to actuate the isolating switch (5), in order to decouple the on-board electrical system from the DC/DC converter (11), depending on a value of the determined reverse voltage (U, Ua, Ub).

12 Claims, 3 Drawing Sheets

(51) Int. Cl.
*H02M 1/32* (2007.01)
*H02M 3/335* (2006.01)
*H03K 17/082* (2006.01)
*H02H 7/125* (2006.01)

(52) U.S. Cl.
CPC .... *H02M 3/33592* (2013.01); *H03K 17/0822* (2013.01); *B60L 2210/10* (2013.01); *Y02B 70/1475* (2013.01)

(58) Field of Classification Search
CPC ....... H01L 2924/00; H01L 2924/00014; H01L 2924/48091; H01L 2924/48227
See application file for complete search history.

(56) References Cited

FOREIGN PATENT DOCUMENTS

| | | | |
|---|---|---|---|
| CN | 103208954 A | | 1/2013 |
| DE | 102007031494 | | 2/2008 |
| DE | 102011076573 | * | 11/2012 |

* cited by examiner

ON-BOARD ELECTRICAL SYSTEM ISOLATING CIRCUIT FOR DC/DC CONVERTERS, AND METHOD FOR ISOLATING AN ON-BOARD ELECTRICAL SYSTEM FROM A DC/DC CONVERTER

BACKGROUND OF THE INVENTION

The invention relates to an on-board electrical system isolating circuit for a DC/DC converter, in particular for a push-pull rectifier with synchronous rectification, and to a method for isolating an on-board electrical system from a DC/DC converter.

Synchronous rectifier circuits are usually used in potential-isolating DC/DC converters, for example for supplying a low-voltage on-board electrical system of a vehicle. The power semiconductor switches, for example MOSFETs, used for this purpose have a lower voltage loss than diodes precisely in the case of relatively high DC currents, as a result of which the efficiency of the rectifier can be increased.

During the operation of the synchronous rectifier circuits, overvoltages may occur at the power semiconductor switches and may overload and hence permanently damage the power semiconductor switches. Therefore, countermeasures such as snubber circuits are usually used, which are intended to avoid overvoltages at the power semiconductor switches.

It may nevertheless happen that a power semiconductor switch in the synchronous rectifier circuit is damaged and as a consequence switches permanently in the on state. In such a case, an undesired reverse current from the secondary-side on-board electrical system into the synchronous rectifier circuit occurs, whereby electrical energy stores of the on-board electrical system may be discharged. If the on-board electrical system can no longer be supplied with enough energy, specific vehicle components may also fail in their function. For safety reasons it is therefore desirable to prevent such reverse currents in the case of a fault in the synchronous rectifier circuit.

The document DE 41 38 943 C1 for example discloses a two-voltage on-board electrical system, with a DC/DC converter arranged between the two partial on-board electrical systems, said DC/DC converter being part of a charging/isolating module which, depending on signals fed, for example depending on measured currents, interrupts the connection between the two partial on-board electrical systems and thus prevents perturbing reactions from one partial on-board electrical system into the other in the case of a fault.

SUMMARY OF THE INVENTION

In accordance with one aspect, the present invention provides an on-board electrical system supply system, comprising a DC/DC converter having at least one semiconductor rectifier element, two supply terminals for an on-board electrical system, which are coupled to the DC/DC converter on the output side, an isolating switch coupled between one of the supply terminals and the DC/DC converter, and an on-board electrical system isolating circuit designed to determine a reverse voltage at at least one of the semiconductor rectifier elements and to drive the isolating switch for decoupling the on-board electrical system from the DC/DC converter depending on a value of the determined reverse voltage.

In accordance with a further aspect, the present invention provides a method for isolating an on-board electrical system from a DC/DC converter, comprising the steps of converting a supply voltage into an on-board electrical system voltage by means of a DC/DC converter, determining a reverse voltage at at least one of the semiconductor rectifier elements of the DC/DC converter, and driving an isolating switch for decoupling the on-board electrical system from the DC/DC converter depending on the value of the determined reverse voltage.

One concept of the present invention involves detecting the reverse current from the on-board electrical system by means of the measurement of the voltage at the semiconductor elements of the DC/DC converter coupling the on-board electrical system to the secondary-side system. If a defect or a failure of one of the semiconductor elements causes a reverse current, this can be identified from a fall in the reverse voltage below a specific reverse voltage threshold or into a specific reverse voltage range. If a reverse voltage is identified for a minimum duration in a critical range that indicates a defect or failure of one of the semiconductor elements, the on-board electrical system isolating circuit can isolate the on-board electrical system from the DC/DC converter via an isolating switch.

This advantageously makes it possible to ensure that reverse currents from the on-board electrical system through the DC/DC converter are effectively prevented. This prevents a discharge of electrical energy stores in the on-board electrical system and accordingly a failure of safety-critical on-board electrical system components.

Moreover, additional sensors which explicitly measure a reverse current, such as, for example, Hall sensors or shunt resistors, can be dispensed with. Firstly, this reduces the necessary implementation costs; secondly, the power efficiency of the DC/DC converter is not diminished as a result.

Finally, the measurement of the reverse voltage of semiconductor elements of the DC/DC converter, compared with conventional methods, is more accurate and less dependent on the temperature of the system or manufacturing-dictated tolerances.

In accordance with one embodiment of the on-board electrical system supply system according to the invention, the DC/DC converter may furthermore comprise a transformer having a primary-side winding and a secondary-side winding with a center tap, an output inductance, which is connected to the center tap and a first of the supply terminals; and a rectifier circuit having two semiconductor rectifier elements, which are respectively connected to the end-side taps of the secondary-side winding and which are designed for generating a rectified output voltage at a second of the supply terminals.

In accordance with a further embodiment of the on-board electrical system supply system according to the invention, the semiconductor rectifier elements may comprise synchronous rectifier switches. In accordance with an alternative embodiment of the on-board electrical system supply system according to the invention, the semiconductor rectifier elements may comprise semiconductor diodes.

In accordance with a further embodiment of the on-board electrical system supply system according to the invention, the on-board electrical system supply system may furthermore comprise an intermediate circuit capacitor coupled between the two supply terminals.

In accordance with a further embodiment of the on-board electrical system isolating circuit according to the invention, the on-board electrical system isolating circuit may comprise a comparator designed to determine an undershooting of a first threshold value for the reverse voltage of the semiconductor rectifier elements, and a flip-flop designed to output a drive signal for the isolating switch depending on an output signal of the comparator.

In this case, in accordance with a further embodiment of the on-board electrical system isolating circuit according to the invention, the comparator may furthermore be designed to determine whether the reverse voltage of the semiconductor rectifier elements exceeds a second threshold value.

In accordance with one embodiment of the method according to the invention, the method may furthermore comprise the step of checking whether the determined reverse voltage undershoots a first threshold value.

In accordance with a further embodiment of the method according to the invention, the method may furthermore comprise checking whether the determined reverse voltage exceeds a second threshold value.

Further features and advantages of embodiments of the invention are evident from the following description with reference to the accompanying drawings.

DETAILED DESCRIPTION

Figure 1:
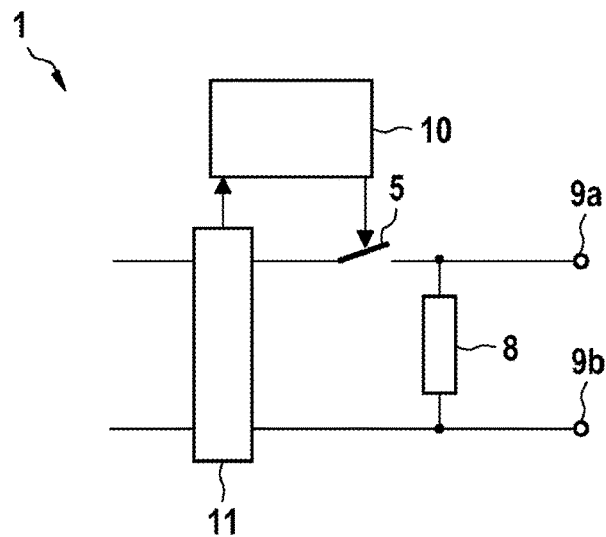
FIG. 1 shows a schematic illustration of an on-board electrical system supply system comprising a DC/DC converter and an on-board electrical system isolating circuit in accordance with one embodiment of the invention.

FIG. 1 shows a schematic illustration of an on-board electrical system supply system 1 comprising a DC/DC converter 11 and an on-board electrical system isolating circuit 10. The on-board electrical system supply system 1 may be used for example in an electrically operatable vehicle, that is to say an electric or hybrid vehicle, for supplying an on-board electrical system of the vehicle. The DC/DC converter 11 may convert an input voltage fed in on the input side, for example from an electrical drive system of an electric or hybrid vehicle, into an output-side on-board electrical system voltage that can be tapped off at two supply terminals 9a, 9b, which are coupled to the DC/DC converter 11 on the output side. The DC/DC converter 11 may comprise at least one semiconductor rectifier element and have any suitable converter topology, for example a buck converter, a boost converter, an inverse converter, a synchronous converter, a flyback converter, a push-pull forward converter or a resonant converter. For voltage smoothing, an intermediate circuit element 8, for example an intermediate circuit capacitor 8, may be connected between the two supply terminals 9a, 9b.

Moreover, the on-board electrical system supply system 1 comprises an isolating switch 5 coupled between one of the supply terminals 9a, 9b and the DC/DC converter 11. The isolating switch 5 may be for example a semiconductor switch, for example a field effect transistor (FET). However, it is likewise possible to provide other semiconductor switches in a corresponding form as the isolating switch 5, for example in the form of an IGBT (Insulated Gate Bipolar Transistor). The on-board electrical system supply system 1 has an on-board electrical system isolating circuit 10 designed to determine a reverse voltage at at least one of the semiconductor rectifier elements of the DC/DC converter 11. The on-board electrical system isolating circuit 10 checks the determined reverse voltage and generates a drive signal for the isolating switch 5 depending on the value of the determined reverse voltage, in order to disconnect the on-board electrical system coupled to the two supply terminals 9a, 9b from the DC/DC converter 11.

In this case, the on-board electrical system isolating circuit 10 can monitor the reverse voltage(s) for example by comparing the reverse voltage(s) with a maximum trigger threshold. If the reverse voltage(s) is (are) below the maximum trigger threshold, which may be in the range of between 1 V and 2 V, for example, for a minimum comparison time, for example 7 μs or more, it may be assumed that the relevant semiconductor rectifier element or the relevant semiconductor rectifier elements is or are defective. The on-board electrical system isolating circuit 10 may then output a drive signal for the isolating switch 5 in order to isolate the on-board electrical system from the DC/DC converter 11.

In the case of intact semiconductor rectifier elements, the reverse voltage is usually less than 0 V as long as the semiconductor is in the on state in the diode forward direction. If the semiconductor undergoes transition from the on state to the off state, the reverse voltage rapidly exceeds the maximum trigger threshold and is at a voltage value which is for example of the same magnitude as or greater than the on-board electrical system voltage.

In order to improve the identification accuracy, the on-board electrical system isolating circuit 10 may for example also monitor the reverse voltage(s) to the effect of whether the reverse voltage(s) will undershoot a minimum trigger threshold. If the reverse voltage(s) is (are) above the minimum trigger threshold, for example 0 V, and below the maximum trigger threshold, for example in the range of between 1 V and 2 V, for a minimum comparison time, for example 7 μs or more, it may be assumed that the relevant semiconductor rectifier element or the relevant semiconductor rectifier elements is or are defective.

Figure 2:
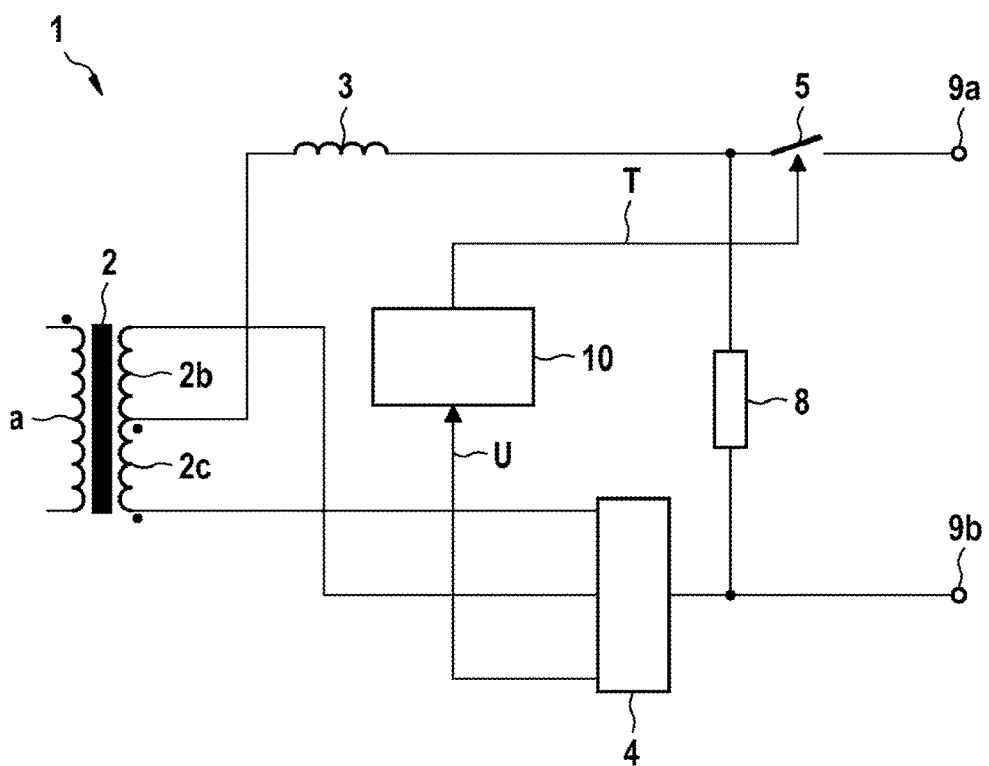
FIG. 2 shows a schematic illustration of an on-board electrical system supply system comprising a DC/DC converter and an on-board electrical system isolating circuit in accordance with a further embodiment of the invention.

In the example in FIG. 2, the DC/DC converter is configured as a push-pull forward converter and comprises a transformer 2 having a primary-side winding 2a and a secondary-side winding, which is split into two sections 2b and 2c by means of a center tap. The transformer 2 may be designed for example for converting a high voltage into a low voltage and have for example a turns ratio between the primary-side and secondary-side windings of above one, in particular for example 10:1. The turns ratio of the two secondary-side windings sections 2b and 2c may in this case be one, in particular; that is to say that the two secondary-side winding sections 2b and 2c have an identical number of turns.

By way of example, a high-voltage source with an inverter connected thereto in a full-bridge circuit for converting the DC voltage of the high-voltage source into a high-voltage AC voltage may be coupled on the primary side 2a of the transformer 2.

The center tap of the transformer 2 is connected to a first output terminal 9a via a secondary-side inductance 3. The two end-side taps of the respective secondary-side windings sections 2b and 2c are connected to two inputs of a rectifier circuit 4. The rectifier circuit 4 may comprise for example a synchronous rectifier having active switching elements. However, it may also be possible to configure the rectifier circuit 4 with passive switching elements. The DC/DC converter may thus comprise a push-pull rectifier circuit with passive or active rectification.

The rectifier circuit 4 is designed to tap off from the end-side taps of the respective secondary-side winding sections 2b and 2c a voltage present at the transformer 2 on the secondary side and to convert it into a DC voltage at a second output terminal 9b by means of suitable circuitry. In other words, an output DC voltage can be tapped off between the output terminals 9a and 9b during the operation of the DC/DC converter.

Furthermore, a DC voltage intermediate circuit 8 which may serve for voltage smoothing may be provided between the first and second output terminals 9a, 9b. The DC voltage intermediate circuit 8 may comprise for example an intermediate circuit capacitor or some other DC voltage source such as, for example, a battery or a rechargeable battery.

The on-board electrical system isolating circuit 10 may for example be implemented in a microprocessor and determine a reverse voltage U at at least one of the semiconductor rectifier elements of the rectifier circuit 4. If the determined reverse voltage is in a range in which a failure or a defect of one of the semiconductor rectifier elements of the rectifier circuit 4 may be deduced, the on-board electrical system isolating circuit 10 may output a drive signal T to the isolating switch 5 for decoupling the on-board electrical system from the DC/DC converter.

Figure 3:
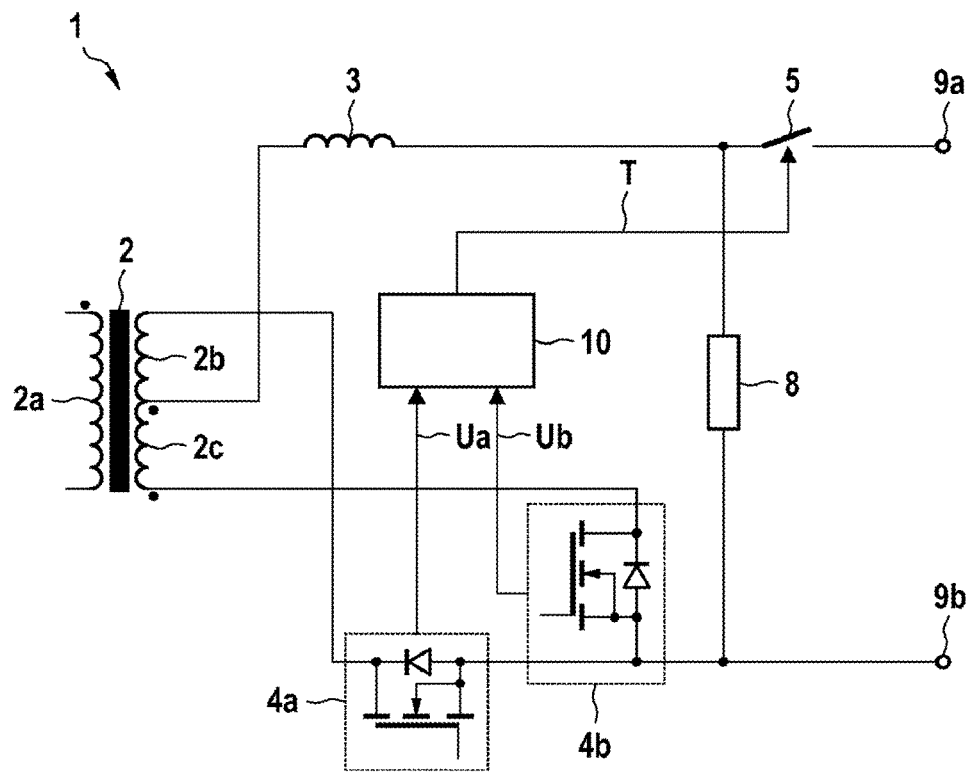
FIG. 3 shows a schematic illustration of an on-board electrical system supply system comprising a DC/DC converter and an on-board electrical system isolating circuit in accordance with a further embodiment of the invention.

FIG. 3 shows an on-board electrical system supply system comprising a DC/DC converter and an on-board electrical system isolating circuit 10 in accordance with a further embodiment. The DC/DC converter in FIG. 3 differs from the DC/DC converter 1 in FIG. 2 essentially in the higher degree of detail of the components illustrated.

The synchronous rectifier circuit 4 is realized by two synchronous rectifier switches 4a and 4b in FIG. 3. In this case, each of the synchronous rectifier switches 4a, 4b comprises an active switching element and a freewheeling diode connected in parallel therewith. It is clear in this case that the freewheeling diode may be the parasitic diode of the active switching element itself when semiconductor switches, for example MOSFET switches, are used.

The synchronous rectifier switches 4a, 4b used may in this case each comprise semiconductor switches, such as field effect transistors (FETs), for example. In the embodiments shown, the semiconductor switches are illustrated in each case as normally off n-MOSFETs (n-conducting Metal Oxide Semiconductor Field-Effect Transistors, enhancement-mode), but it is likewise possible to provide other semiconductor switches in a corresponding form, for example in the form of IGBTs (Insulated Gate Bipolar Transistors), JFETs (Junction Field-Effect Transistors) or as p-MOSFETs (p-conducting Metal Oxide Semiconductor Field-Effect Transistors).

Alternatively, instead of the synchronous rectifier switches 4a, 4b, it is also possible to use passive semiconductor components such as semiconductor diodes, for example, in order to realize a passive rectifier circuit 4.

The on-board electrical system isolating circuit 10 measures the reverse voltages Ua and Ub of the synchronous rectifier switches 4a, 4b and, in the event of an identified defect or failure of one of the two synchronous rectifier switches 4a, 4b, generates the drive signal T for isolating the on-board electrical system from the DC/DC converter by means of the isolating switch 5.

Figure 4:
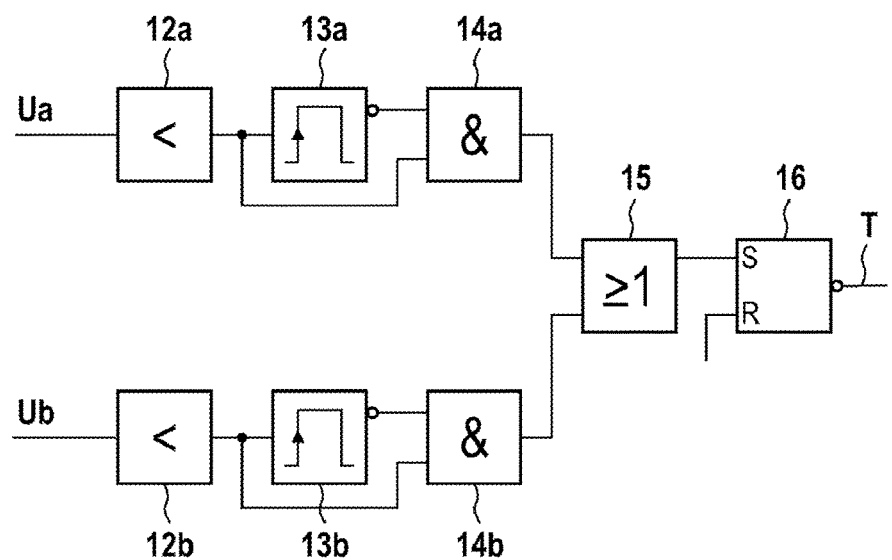
FIG. 4 shows a schematic illustration of a circuit diagram for an on-board electrical system isolating circuit in accordance with a further embodiment of the invention.
Figure 5:
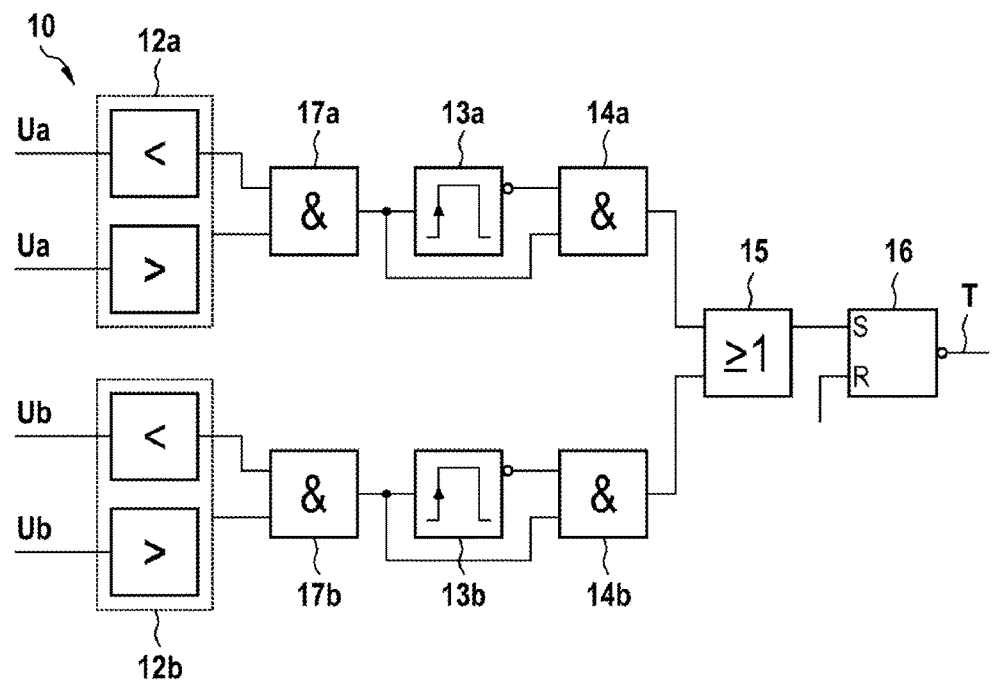
FIG. 5 shows a schematic illustration of a circuit diagram for an on-board electrical system isolating circuit in accordance with a further embodiment of the invention.

FIGS. 4 and 5 show exemplary implementations for a logic circuit for monitoring the reverse voltages Ua and Ub in the on-board electrical system isolating circuit 10. The determined values Ua and respectively Ub for the reverse voltages of the individual semiconductor rectifier elements of the rectifier circuit 4 are fed into comparators 12a and 12b designed to determine an undershooting of a first threshold value or of first threshold values for the reverse voltages of the semiconductor rectifier elements. The comparator signal is fed into an OR circuit 15 via a comparison time trigger 13a, 14a and 13b, 14b, respectively, such that if one of the two comparator signals is below the first threshold value over a minimum time period controlled by the comparison time trigger, a flip-flop 16 is switched which can output a drive signal for the isolating switch 5 depending on the comparator signal of the comparator 12a, 12b.

As shown by way of example in FIG. 5, the comparator 12a and respectively 12b may furthermore be designed to determine whether the reverse voltage(s) Ua and/or Ub of the semiconductor rectifier elements of the rectifier circuit 4 exceed(s) a second threshold value. The corresponding drive signal T for isolating the on-board electrical system from the DC/DC converter is set at the flip-flop 16 only if it is determined in an AND circuit 17a and/or 17b that the reverse voltage(s) Ua and/or Ub of the semiconductor rectifier elements of the rectifier circuit 4 is (are) between the second threshold value and the first threshold value, for example between 0 V and approximately 1 V to 2 V, over a minimum comparison time period.

Figure 6:
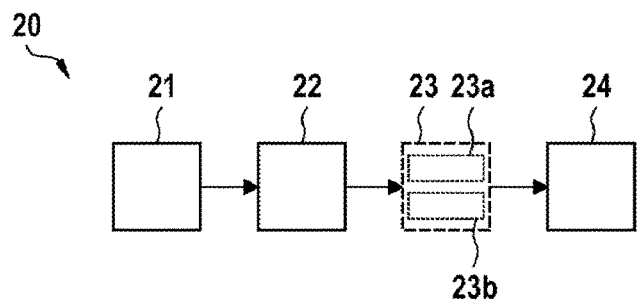
FIG. 6 shows a schematic illustration of a method for isolating an on-board electrical system from a DC/DC converter in accordance with a further embodiment of the invention.

FIG. 6 shows one exemplary method 20 for isolating an on-board electrical system from a DC/DC converter, for example the DC/DC converter 11 in the on-board electrical system supply system from FIGS. 1 to 3. The method 20 comprises, in a first step 21, converting a supply voltage into an on-board electrical system voltage by means of a DC/DC converter 11. A second step involves determining a reverse voltage at at least one of the semiconductor rectifier elements of the DC/DC converter 11.

Optionally, substep 23a of step 23 may then involve carrying out checking of whether the determined reverse voltage undershoots a first threshold value. Likewise, substep 23b of step 23 may involve carrying out checking of whether the determined reverse voltage exceeds a second threshold value. Depending on the checking, step 24 may then involve implementing an isolating switch 5 for decoupling the on-board electrical system from the DC/DC converter 11 depending on the value of the determined reverse voltage.

The invention claimed is:

1. An on-board electrical system supply system (1), comprising:
 a DC/DC converter (11) having at least one semiconductor rectifier element (4);
 two supply terminals (9a, 9b) for an on-board electrical system, which are coupled to the DC/DC converter (11) on the output side;
 an isolating switch (5) coupled between one of the supply terminals (9a, 9b) and the DC/DC converter (11); and an on-board electrical system isolating circuit (10) configured to measure a reverse voltage (U; Ua; Ub) at at least one of the semiconductor rectifier elements (4) and to drive the isolating switch (5) for decoupling the on-board electrical system from the DC/DC converter (11) depending on a value of the measured reverse voltage (U; Ua; Ub).

2. The on-board electrical system supply system (1) as claimed in claim 1, wherein the DC/DC converter (11) comprises:
   a transformer (2) having a primary side winding (2a) and a secondary side winding (2b, 2c) with a center tap;
   an output inductance (3), which is connected to the center tap and a first of the supply terminals (9a); and
   a rectifier circuit (4) having two semiconductor rectifier elements (4a, 4b), which are respectively connected to the end-side taps of the secondary-side winding (2b, 2c) and which are designed for generating a rectified output voltage at a second of the supply terminals (9b).

3. The on-board electrical system supply system (1) as claimed in claim 2, wherein the semiconductor rectifier elements (4a, 4b) comprise synchronous rectifier switches.

4. The on-board electrical system supply system (1) as claimed in claim 2, wherein the semiconductor rectifier elements (4a, 4b) comprise semiconductor diodes.

5. The on-board electrical system supply system (1) as claimed in claim 1, furthermore comprising:
   an intermediate circuit capacitor (8) coupled between the two supply terminals (9a, 9b).

6. The on-board electrical system supply system (1) as claimed in claim 1, wherein the on-board electrical system supply system is for an electric or hybrid vehicle.

7. An on-board electrical system supply system (1), comprising:
   a DC/DC converter (11) having at least one semiconductor rectifier element (4);
   two supply terminals (9a, 9b) for an on-board electrical system, which are coupled to the DC/DC converter (11) on the output side;
   an isolating switch (5) coupled between one of the supply terminals (9a, 9b) and the DC/DC converter (11); and
   an on-board electrical system isolating circuit (10) configured to determine a reverse voltage (U; Ua; Ub) at at least one of the semiconductor rectifier elements (4) and to drive the isolating switch (5) for decoupling the on-board electrical system from the DC/DC converter (11) depending on a value of the determined reverse voltage (U; Ua; Ub),
   wherein the on-board electrical system isolating circuit (10) includes:
      a comparator (12a; 12b) configured to determine an undershooting of a first threshold value for the reverse voltage (Ua; Ub) of the semiconductor rectifier elements (4); and
      a flip-flop (16) configured to output a drive signal for the isolating switch (5) depending on an output signal of the comparator (12a; 12b).

8. The on-board electrical system supply system (1) as claimed in claim 7, wherein the comparator (12a; 12b) is furthermore configured to determine whether the reverse voltage (Ua; Ub) of the semiconductor rectifier elements (4) exceeds a second threshold value.

9. A method (20) for isolating an on-board electrical system from a DC/DC converter (11), comprising the following steps:
   converting (21) a supply voltage into an on-board electrical system voltage by means of a DC/DC converter (11);
   measuring (22) a reverse voltage (U; Ua; Ub) at at least one of the semiconductor rectifier elements (4) of the DC/DC converter (11); and
   driving (24) an isolating switch (5) for decoupling the on-board electrical system from the DC/DC converter (11) depending on the value of the measured reverse voltage (U; Ua; Ub).

10. The method (20) as claimed in claim 9, furthermore comprising the following step:
   checking (23a) whether the measured reverse voltage (U; Ua; Ub) undershoots a first threshold value.

11. The method (20) as claimed in claim 10, furthermore comprising the following step:
   checking (23b) whether the measured reverse voltage (U; Ua; Ub) exceeds a second threshold value.

12. The method (20) as claimed in claim 11, wherein the isolating switch (5) is driven to decouple the on-board electrical system when the measured reverse voltage is between the second threshold value and the first threshold value.

* * * * *